United States Patent [19]

Sundahl, Jr.

[11] 3,791,861

[45] Feb. 12, 1974

[54] METHOD FOR PRODUCING THIN FILM CIRCUITS ON HIGH PURITY ALUMINA SUBSTRATES

[75] Inventor: Robert Charles Sundahl, Jr., Bethlehem, Pa.

[73] Assignee: Bell Telephone Laboratories, Incorporated, Murray Hill, N.J.

[22] Filed: Apr. 16, 1971

[21] Appl. No.: 134,665

[52] U.S. Cl. ................. 117/213, 117/212, 117/217, 117/221, 117/47 R

[51] Int. Cl. ............................................ H05k 3/18

[58] Field of Search ... 117/212, 217, 221, 213, 227, 117/47, 93.3

[56] References Cited

UNITED STATES PATENTS

| | | | |
|---|---|---|---|
| 2,885,310 | 5/1959 | Olson et al. | 117/47 H X |
| 3,212,918 | 10/1965 | Tsu et al. | 117/212 X |
| 3,032,397 | 5/1962 | Niederhauser | 117/47 H X |
| 2,901,381 | 8/1959 | Teal | 117/47 H X |
| 3,655,845 | 4/1972 | Chiku | 106/65 X |

*Primary Examiner*—Ralph S. Kendall
*Attorney, Agent, or Firm*—J. C. Fox

[57] ABSTRACT

In the production of thin film circuits, adhesion of the metallization to the surface of high purity alumina substrates is enhanced by annealing the substrates prior to metallization.

14 Claims, 3 Drawing Figures

INVENTOR
R. C. SUNDAHL, JR.
BY John C. Fox
ATTORNEY

METHOD FOR PRODUCING THIN FILM CIRCUITS ON HIGH PURITY ALUMINA SUBSTRATES

BACKGROUND OF THE INVENTION

1. Field of the Invention

This invention relates to a method for producing thin film circuits on high purity alumina substrates in which adhesion of the metallization to the substrates is enhanced by treating the substrates prior to metallization.

2. Description of the Prior Art

The use of high purity alumina (at least 99 percent $Al_2O_3$) as a substrate material in thin film circuit manufacture is growing due to the mechanical strength, chemical inertness, thermal conductivity, electric resistivity, relative freedom from surface defects, and economy of this material.

It is critical to the reliability of thin film components such as conductor paths, resistors and capacitors that the metallization which forms these components adheres firmly to the supporting substrates. Such adherence is particularly critical at the locations where leads are bonded to the metallization since poor adhesion at these locations could result in failure of the lead bonds.

Unfortunately, lead bond and other component failures due to poor adhesion are recurrent problems in thin film circuit manufacture, thus contributing to low production yields and consequent high manufacturing costs.

SUMMARY OF THE INVENTION

It has now been discovered that adhesion of metallization to high purity alumina substrates is enhanced by the presence of cation impurities on the surface of the substrates and that these impurities, while ordinarily present on as-fired substrate surfaces, may nevertheless be lost by (1) volatilization, caused for example, by excessive firing times and/or temperatures, (2) mechanical abrasion of the surface, or (3) chemical etching of the surface.

Since mechanical abrasion (for example, grinding) and chemical etching are often essential steps in the fabrication of thin film circuits, an essential aspect of the invention is the restoration prior to metallization of surface cation impurities lost as a result of the performance of these steps or as a result of excessive firing conditions.

According to a preferred embodiment of the invention, such restoration is accomplished by annealing the substrate prior to metallization so as to promote diffusion to the surface of cation impurities present in the grain boundaries of the substrate.

Most commercially available high purity alumina substrates contain cation impurities in the grain boundaries. However, for substrates having little or no cation impurities in the grain boundaries, or for single crystal substrates, deposition of cation impurities on the surface of the substrate may be accomplished in a variety of ways, such as by vapor deposition, sputtering or by heating the substrate in an atmosphere containing the impurities. A convenient way of achieving such an atmosphere is to heat the substrate in a furnace whose side walls comprise ceramic insulation containing the impurities.

DETAILED DESCRIPTION OF THE INVENTION

Figure 1:
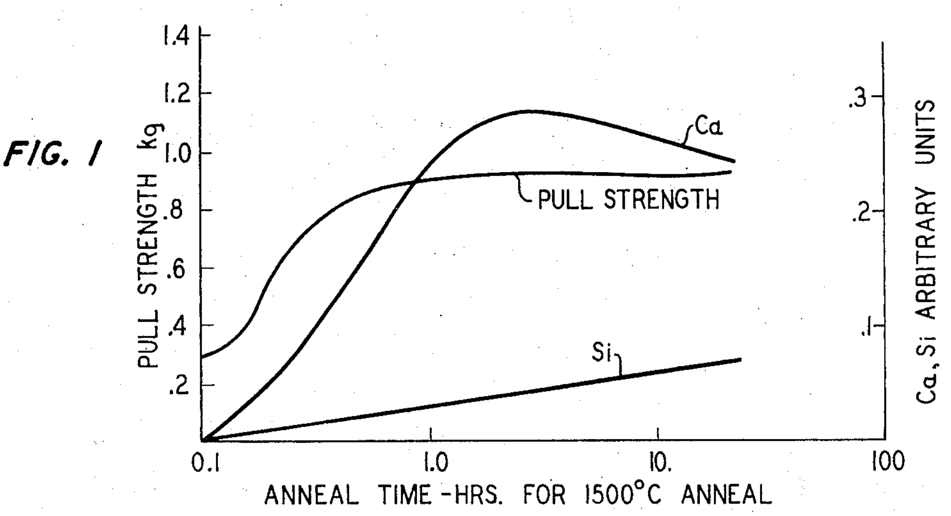
FIG. 1 is a graph of pull strength in kilograms and Ca and Si impurity levels in arbitrary units versus annealing time in hours for an anneal at 1,500° C. of a metallized high purity alumina substrate material of the invention.
Figure 2:
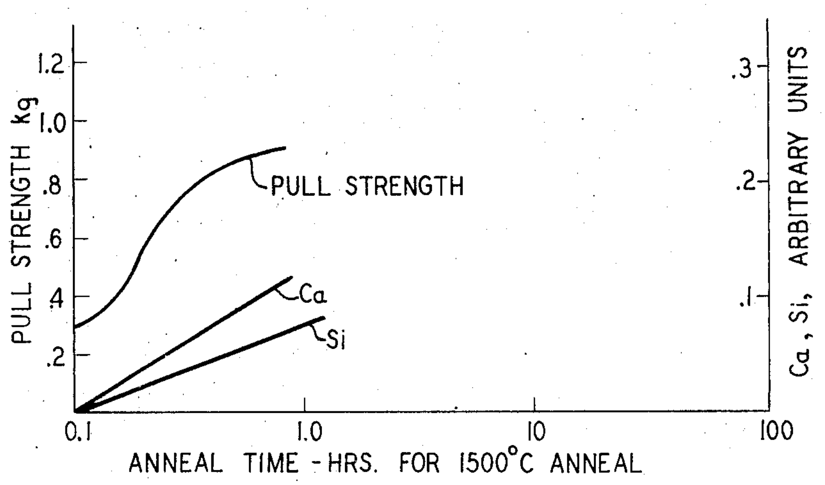
FIG. 2 is a graph similar in all respects to the graph of FIG. 1 for a second metallized substrate material of the invention.

The high purity alumina substrates for which surface impurities are important to adhesion are those containing at least 99 weight percent $Al_2O_3$, below which the presence of other additives would mask the effect of such impurities on adhesion. It is ordinarily preferred for the optimum reliability of metallized components that the substrate be at least 99.5 weight percent $Al_2O_3$.

Mechanical abrasion of the surface prior to metallization may take the form of shot peening of the surface to remove burrs. These burrs may be present on the as-fired substrate or may be formed during implacement of holes in the substrate by laser drilling. In specialized cases in which highly smooth substrate surfaces are desired for optimum component reliability, the surfaces may be ground, for example, with a diamond wheel.

Substrates are ordinarily subjected to chemical etching in order to remove defective metallized patterns. Typical etchants are phosphoric acid or a mixture of hydrofluoric and nitric acids in water.

The amount of surface cation impurities ordinarily required for substantial improvement of metal adhesion to the substrate is about one-fourth of a monolayer. In those cases in which it is intended to employ annealing to restore the surface impurities removed by machining or etching, ordinarily a substrate material of the above purity will contain cation impurities in the grain boundaries in sufficient amounts to result in the requisite amount of surface impurities when annealing is carried out at a temperature of from 1,200° C. for at least 10 hours to 1,600° C. for at least 15 minutes. Preferred ranges for annealing are from 1,400° C. for at least 1 hour to 1,500° C. for at least 30 minutes. Annealing for times beyond 10 hours is unnecessary and commercially undesirable. Furthermore, annealing at 1,500° C. for more than 10 hours results in some loss of surface impurities by volatilization.

After deposition or restoration of the surface impurities on the substrate, the desired electronic component is formed by depositing successive layers of various metals in the desired pattern or patterns. Ordinarily the first metal to be deposited will be either tantalum, tantalum nitride ($Ta_2N$) or titanium. A variety of metallizations are used in the art, the particular configuration depending upon the application envisioned.

The following examples are intended to illustrate some typical processing conditions for the production of thin film circuits and the effect of annealing the substrate upon adhesion of the metallization.

EXAMPLE 1

About 500 alumina substrate samples were prepared by pressing high purity alumina powder having the nominal composition shown in Table I and firing the resultant pressed bodies at 1,700° C. for 1 hour.

Table I

Chemical Analysis of Alumina Powder

| Component | Weight Percent |
|---|---|
| MgO | 0.100 |
| $SiO_2$ | 0.140 |
| CaO | 0.054 |
| $Na_2O$ | 0.047 |
| $Fe_2O_3$ | 0.024 |

Figure 3:
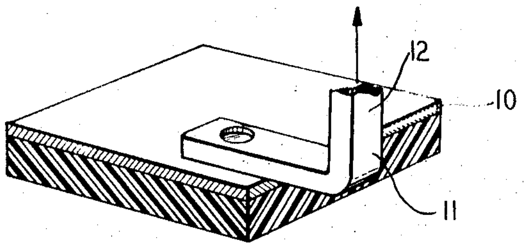
FIG. 3 is a perspective view of a portion of a metallized substrate of the invention, including detail of a lead bonded to the metallization.

The resultant fire bodies exhibited a high density (99.8 percent of theoretical density) and had approximately the composition shown in Table I. These fired bodies were then ground to 2.5 × 2.5 × 0.08 centimeter dimensions with a 400 grit diamond wheel. The ground samples were then cleaned by immersing them successively in ultrasonic baths of trichloroethylene, acetone and methanol, a boiling bath of hydrogen peroxide solution, rinsing them in deionized water and drying them in an oven containing nitrogen. Following this the samples were annealed at 1,500° C. in air. Five lots of about 100 samples each were annealed for 0, 30, 60, 120 and 1,000 minutes, respectively. Representative samples from each lot were then subjected to surface analysis by Auger Electron Spectroscopy (AES). The samples were then metallized by sequentially evaporating layers of tantalum, nitride, titanium, palladium and gold to a total thickness of about 15,000 A. Following this a 0.13 by 0.38 millimeter gold plated copper lead was attached to each metallized sample by thermal compression bonding and 90° pull tests were performed on these bonds. The appearance of the samples which were given the pull tests is represented in FIG. 3 in which metallized layer 10 has been formed on substrate 11 and lead 12 bonded to metallized layer 10. A force represented by the arrow is exerted upon lead 12 in a direction normal to the plane of the substrate. Pull strength is defined by the force required to pull the bonded lead from the metallized layer substrate or, alternatively, to break the lead. Minimum pull strength for acceptable adhesion in the envisioned applications is generally about 0.6 kilograms. This value, in general, corresponds to a lead break. The results of these pull tests and of the AES analyses are shown in FIG 1 in which pull strength in kilograms and Ca and Si impurity levels in arbitrary units are plotted against annealing time in hours for a 1,500° C. anneal. It is apparent that there is a significant improvement in adhesion as a result of annealing the ground substrate samples. These results are typical of behavior observed on a wide variety of alumina substrate materials and metallization systems.

EXAMPLE 2

About 400 alumina substrate samples were selected from a lot (designated Lot I) of commercially obtained substrates, prepared by tape-casting and firing at 1,700° C. material having the nominal composition shown in Table II.

Table II

Nominal Bulk Impurity Levels in Tape-Cast Alumina Substrates

| Component | Weight Percent |
|---|---|
| $Fe_2O_3$ | 0.040 |
| $Ga_2O_3$ | 0.015 |
| BaO | 0.010 |
| CaO | 0.040 |
| MgO | 0.330 |
| $TiO_2$ | 0.007 |
| $Na_2O$ | 0.010 |
| $SiO_2$ | 0.300 |

The samples were ground and cleaned as in Example I and then annealed for 40 minutes in wet hydrogen at 1,525° C. Representative samples were subjected to AES surface analysis in the as-received, ground and annealed states, and were then metallized, bonds attached and pull tests performed as in Example I. Results of pull tests and AES analyses are shown in Table III.

Table III

| Surface Preparation | AES Signal Levels | | Percent Pull Tests above minimum acceptance level |
|---|---|---|---|
| | $S_{Ca}/S_O$ | $S_{Si}/S_O$ | |
| as-received | 0.007±0.003 | 0.010±0.001 | 100 |
| ground | 0.003±0.003 | 0.001±0.001 | 0 |
| ground and annealed | 0.060±0.010 | 0.008±0.002 | 100 |

It is apparent from the results that grinding significantly impairs adhesion, and that annealing substantially improves adhesion of the ground samples.

EXAMPLE 3

About 400 alumina substrate samples were selected from a lot (designated Lot II) of the commercially obtained substrates of Example I. The samples were first annealed for 60 minutes in vacuum at 1,500° C., then etched for 30 minutes in concentrated $H_3PO_4$ at 150° C., and finally reannealed for 60 minutes in vacuum at 1,500° C. Representative samples were subjected to AES surface analysis in the as-received, annealed, etched and reannealed states, and were then metallized, bonds attached and pull tests performed as in Example I. Results of pull tests and AES analyses are shown in Table IV.

Table IV

AES and Adhesion Results for Lot II Alumina Substrates

| Surface Preparation | AES Signal Levels | | Percent Pull Tests Above Minimum Acceptance Level |
|---|---|---|---|
| | $S_{CA}/S_O$ | $S_{Si}/S_O$ | |
| as-received | 0 | 0.006±0.001 | 92 |
| annealed | 0.008±0.004 | 0.006±0.001 | 100 |
| etched | 0.004±0.004 | 0.004±0.001 | 50 |
| reannealed | 0.008±0.001 | 0.008±0.001 | 100 |

It is apparent from the results that etching significantly impairs adhesion, and that annealing substantially improves adhesion of the ground samples. It is also apparent that annealing of the as-received samples results in some improvement in adhesion.

What is claimed is:

1. A method for metallizing a fired ceramic substrate consisting of at least 99 percent $Al_2O_3$ wherein the substrate is subjected to conditions prior to metallization which remove from the surface of the substrate the cation impurities Ca and Si inherently caused to accumulate thereon by firing of the ceramic, the improvement comprising annealing the substrate to restore said impurities to the surface of the substrate prior to metallization, whereby the adhesion of the metallization to the substrate is improved.

2. The method of claim 1 in which said substrate consists of at least 99.5 percent $Al_2O_3$.

3. The method of claim 1 in which said annealing is carried out at a temperature of from 1,200°C. for at least 10 hours to 1,600°C. for at least 15 minutes.

4. The method of claim 3 in which said annealing is carried out at a temperature of from 1,400°C. for at least 1 hour to 1,500°C. for at least 30 minutes.

5. The method of claim 1 in which the conditions for removal comprise excessive firing of the ceramic substrate.

6. The method of claim 1 in which the conditions for removal comprise mechanical abrasion of the substrate surface.

7. The method of claim 1 in which the conditions for removal comprise chemical etching of the substrate surface.

8. The method of claim 1 in which metallization comprises forming on the substrate surface a layer selected from the group consisting of Ta, $Ta_2N$ and Ti layers.

9. A method for metallizing a fired ceramic substrate consisting of at least 99 percent $Al_2O_3$ wherein the substrate is subjected to conditions prior to metallization which remove from the surface of the substrate the cation impurities Ca and Si inherently caused to accumulate thereon by firing of the ceramic the improvement comprising restoring said impurities to the surface of the substrate by deposition of the impurities on the surface of the substrate prior to metallization whereby the adhesion of the metallization to the substrate is improved.

10. The method of claim 9 in which the amount of surface cation impurities deposited is at least one fourth of a monolayer.

11. The method of claim 9 in which the conditions for removal comprise excessive firing of the ceramic substrate.

12. The method of claim 9 in which the conditions for removal comprise mechanical abrasion of the substrate surface.

13. The method of claim 9 in which the conditions for removal comprise chemical etching of the substrate surface.

14. The method of claim 9 in which metallization comprises forming on the substrate surface a layer selected from the group consisting of Ta, $Ta_2N$ and Ti layers.

* * * * *